United States Patent
Mettler et al.

(10) Patent No.: US 6,870,227 B1
(45) Date of Patent: Mar. 22, 2005

(54) DEVICE FOR PROTECTING AGAINST ELECTROSTATIC DISCHARGE

(75) Inventors: Stephan Mettler, Reutlingen (DE); Steffi Lindenkreuz, Reutlingen (DE); Wolfang Wilkening, Pfullingen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 09/958,627

(22) PCT Filed: Apr. 14, 2000

(86) PCT No.: PCT/DE00/01186
§ 371 (c)(1), (2), (4) Date: Jun. 14, 2002

(87) PCT Pub. No.: WO00/63971
PCT Pub. Date: Oct. 26, 2000

(30) Foreign Application Priority Data

Apr. 16, 1999 (DE) .......................... 199 17 155

(51) Int. Cl.$^7$ .............................................. H01L 23/62
(52) U.S. Cl. ...................... 257/355; 257/362; 257/370; 257/577
(58) Field of Search ................................ 257/355, 362, 257/370, 577, 592, 655

(56) References Cited

U.S. PATENT DOCUMENTS

| 4,463,369 | A | | 7/1984 | Harford | |
| 4,494,134 | A | | 1/1985 | Wildi et al. | |
| 4,979,008 | A | * | 12/1990 | Siligoni et al. | 357/34 |
| 5,155,568 | A | * | 10/1992 | Pernyeszi | 357/38 |
| 5,170,240 | A | * | 12/1992 | Becker | 257/499 |
| 5,245,209 | A | * | 9/1993 | Ishigaki | 257/372 |
| 5,268,588 | A | * | 12/1993 | Marum | 257/362 |
| 5,302,534 | A | * | 4/1994 | Monk et al. | 437/31 |
| 5,324,984 | A | * | 6/1994 | Ogawa | 257/588 |
| 5,471,082 | A | * | 11/1995 | Maeda | 257/362 |
| 5,510,947 | A | * | 4/1996 | Pellegrini et al. | 361/56 |
| 5,976,921 | A | * | 11/1999 | Maeda | 438/202 |
| 6,372,597 | B2 | * | 4/2002 | Colombo et al. | 438/357 |
| 6,768,176 | B1 | * | 7/2004 | Litfin | 257/355 |

FOREIGN PATENT DOCUMENTS

| DE | 197 46 410 | | 4/1999 |
| EP | 2176053 | * | 12/1986 |
| EP | 413054 | * | 8/1989 |
| GB | 2 176 053 | * | 12/1986 |
| JP | 1-187867 | * | 7/1989 |
| JP | 1-187868 | * | 7/1989 |

* cited by examiner

Primary Examiner—Nathan J. Flynn
Assistant Examiner—Ahmed N. Sefer
(74) Attorney, Agent, or Firm—Kenyon & Kenyon

(57) ABSTRACT

A ESD protective device is proposed, including a vertical bipolar transistor connected as a diode, in which the contacting of the collector layer is designed highly resistive. The arrangement, while having a space-saving construction, has an increased snap-back voltage.

18 Claims, 2 Drawing Sheets

DEVICE FOR PROTECTING AGAINST ELECTROSTATIC DISCHARGE

FIELD OF THE INVENTION

The present invention relates to a protective device.

BACKGROUND INFORMATION

A protective device is described in German Patent Application No. 1 97 46 410.6, in which, in the case of electrostatic discharge (ESD), a vertically arranged transistor diode is switched through by a lateral punch-through effect. In the protective device described there, however, the snap-back voltage, i.e. the minimum voltage which has to be present between collector and emitter after breakdown so that the diode remains switched through, is limited to a value which is predetermined by the thickness of the layer of the semiconductor system's surface area, on which the protective device is mounted.

SUMMARY OF THE INVENTION

As compared to that, the protective device according to the present invention has the advantage, at constant breakthrough voltage, of an increased snap-back voltage, as a result of an highly resistive collector interface during the inactive state of the protective device. Thereby, circuits integrated into the semiconductor system can be protected from ESD pulses which are driven by higher voltages. If an integrated circuit is operated, for example, on 25 volt, the snap-back voltage of the protective element has to be greater than 25 volt, so that when an ESD pulse occurs, after discharge of the ESD pulse by the protective element, the operating voltage does not leave the protective element in a switched-through state. The arrangement according to the present invention makes possible the availability of an appropriate protective element in a space-saving manner, since it is no longer necessary, as it was up to now, to combine a plurality of protective elements in order to guarantee a sufficiently high snap-back voltage.

It is particularly advantageous to provide a sinker electrode which is used, on the one hand, to protect from parasitic currents, and with which, on the other hand, the snap-back voltage of the protective device realized by way of a vertically arranged transistor diode can be set in a controlled manner by the corresponding choice of the distance from the connecting layer.

DETAILED DESCRIPTION

Figure 1:
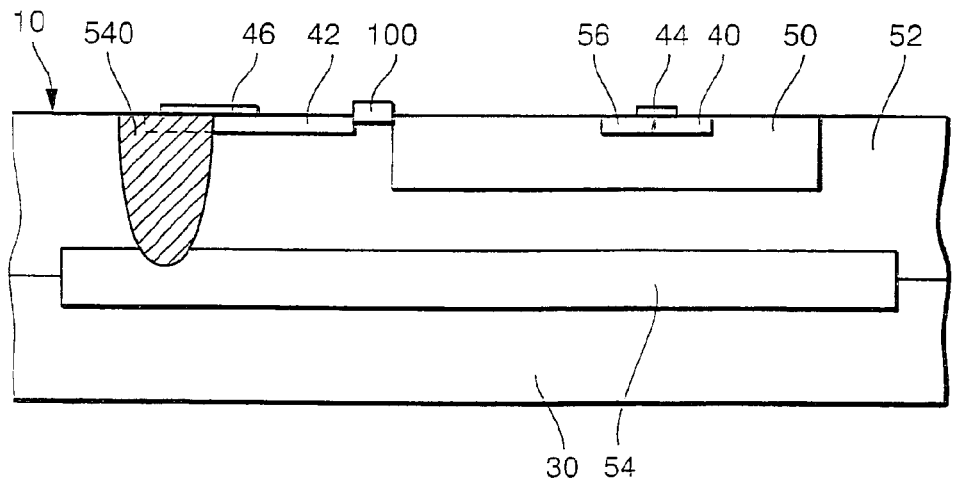
FIG. 1 shows a protective device which has already been described in the above cited, not yet published German patent application.

FIG. 1 shows a cross sectional lateral view of a protective device which is arranged on a p-doped semiconductor substrate 30. An n-doped surface area 52 is deposited epitactically on substrate 30, a strongly n-doped, buried layer 54 being positioned between the surface area and the substrate. On surface 10 of surface area 52 a p-doped well 50 is inserted into which, again, a strongly p-doped region 40 is inserted, as well as a strongly n-doped region 56 immediately next to it, which are electrically connected to each other on the surface by a metallic emitter electrode 44.

An insulating oxide layer 100, arranged on the surface, separates p-well 50 from a strongly n-doped connecting layer 42, inserted next to it in the surface, which can be contacted electrically by a collector electrode 46. Connecting layer 42 overlaps a strongly n-doped sinker electrode 540 inserted into surface area 52, which, in turn, partially overlaps buried area 54. The doping of p-well 50 typically lies in a range near $10^{17}$ cm$^{-3}$. The n-doping of surface area 52 typically lies in a range near $10^5$ cm$^{-3}$, and the doping of the strongly n-doped connecting layer 42 typically in a range near $10^{19}$ cm$^{-3}$.

The blocking polarization of the pn junction between p-well 50 and surface area 52 is relevant to the application of such a device as ESD protection. The clearance between the p-well and connecting layer 42 is dimensioned such that the depletion layer in surface area 52, growing with increasing blocking voltage, reaches connecting layer 42 before the breakdown voltage between p-well 50 and surface area 52 is reached. Thus, breakdown takes place between well 50 and connecting layer 42 as a consequence of the depletion-layer contact effect.

Figure 2:
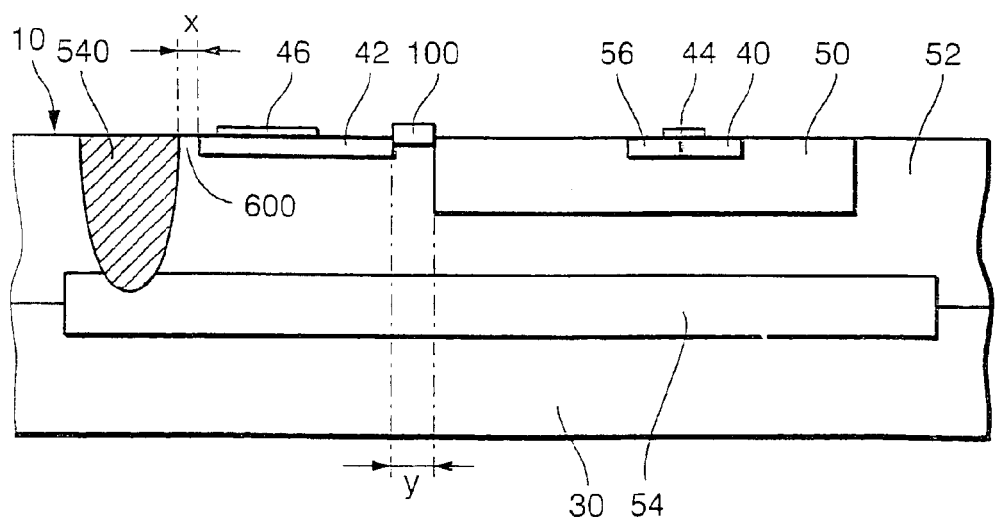
FIG. 2 shows an exemplary embodiment of the present invention.

FIG. 2 shows an exemplary embodiment of the protective device according to the present invention. The same reference numerals as in FIG. 1 denote the same or similar component parts, and are not described again in the following. Connecting layer 42 is positioned at a distance from well 50; the distance is marked as "y". Connecting layer 42 is also positioned at a distance from sinker electrode 540; the corresponding distance is marked as "x". In this case, x has a positive magnitude, that means, that connecting layer 42 and the sinker electrode do not overlap, but rather there exists a local minimum in the pattern of doping concentration along the surface of the sinker electrode and over to connecting layer 42, and this minimum is formed by intermediate region 600, which is a part of surface region 52.

A transistor diode (three-layer diode) is formed from p-well 50 as base, which is short-circuited with strongly n-doped region 56 functioning as emitter via strongly p-doped region 40 and emitter electrode 44, and from buried layer 54 as collector. The electrical interface of the collector via collector electrode 46 comes about by way of strongly n-doped connecting layer 42. For application as ESD protection, the transistor diode is polarized in blocking direction, that is, for example, ground potential is applied to emitter electrode 44 and the positive potential of a terminal of an adjacent integrated circuit to be protected from electrostatic discharges is applied to collector electrode 46. As long as the potential difference between the electrodes lies below the breakdown voltage, the transistor diode blocks (analogously to the arrangement in FIG. 1). Furthermore, connecting layer 42 is connected to the buried layer only in a very highly resistive manner, since each possible current path between the connecting layer and the buried layer proceeds through the surface region (which is weakly doped relatively to the buried layer and the connecting layer). However, this leads, in the case of a breakdown, to the transistor diode's having an increased snap-back voltage compared to the arrangement in FIG. 1. The value of the snap-back voltage can be set by the distance x of the connecting layer from the sinker electrode, and it increases as x gets larger. The breakdown voltage is largely independent of the snap-back voltage, and it can also be selected by a corresponding dimensioning of distance y.

Sinker electrode 540 is not essential for the functioning principle of the arrangement, and can therefore be omitted. However, it is useful for delimiting the protective device from other circuits, and thereby preventing parasitic effects or leakage currents into the substrate. Corresponding devices as described in FIG. 2 can also be realized using interchanged doping.

Figure 3:
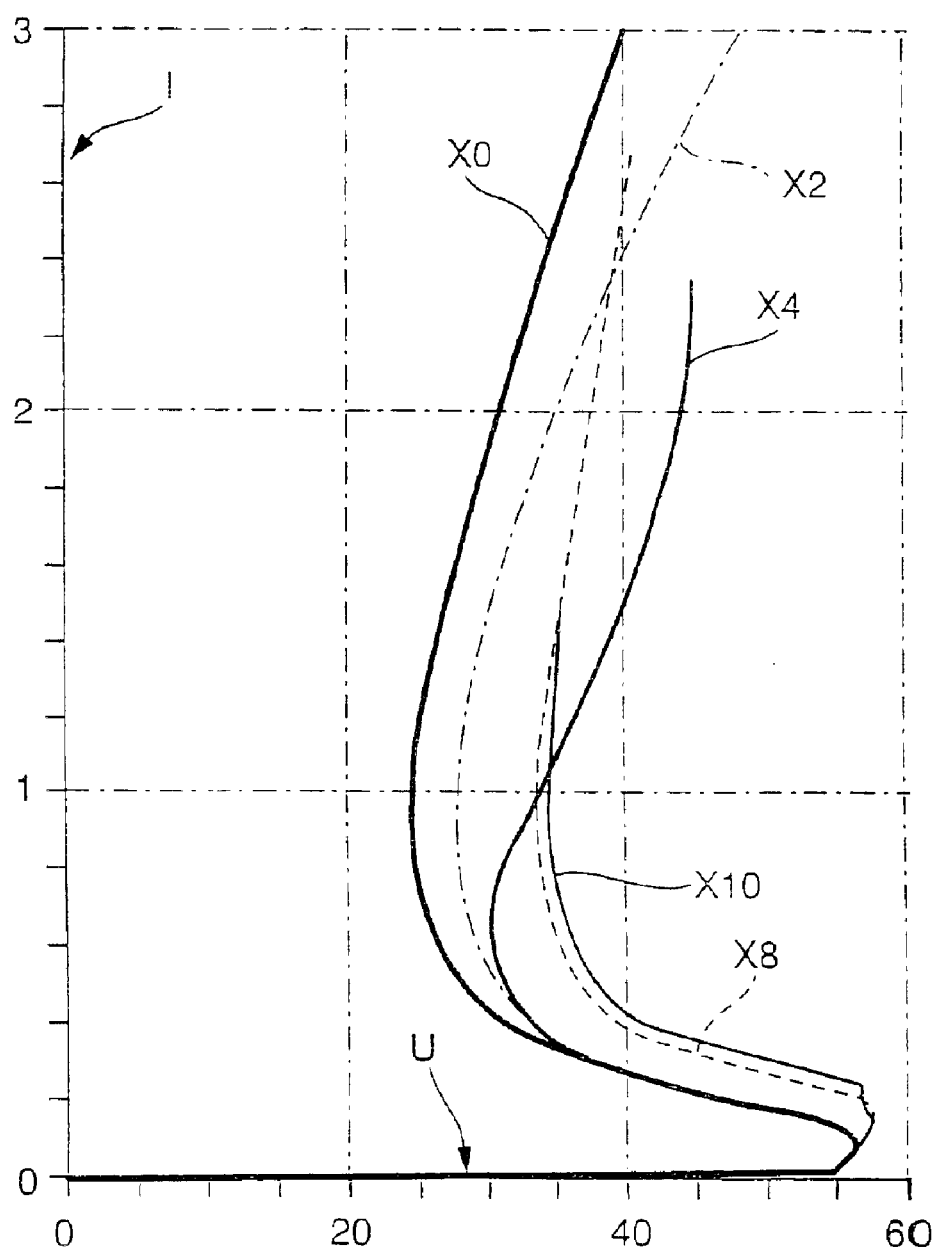
FIG. 3 shows a current-voltage diagram.

FIG. 3 shows a diagram of current I in arbitrary units between collector electrode 46 and emitter electrode 44 as a function of the electrical potential difference in volts between these electrodes. Curve x0 characterizes an arrangement according to FIG. 1, curves x2, x4, x8 and x10 characterize the arrangement according to the present invention as in FIG. 2, the numbers after the x giving in each case the distance of connecting layer 42 from sinker electrode 540. As soon as the voltage reaches a value of approximately 57 volt, all the arrangements become low-resistive in the blocking direction, the snap-back voltage being given by the relative minimum of the voltage after breakdown. In the case of the arrangement as in FIG. 1, the snap-back voltage is about 25 volt. For x greater than zero the snap-back voltage is increased, and the breakdown voltage remains largely the same, as mentioned before. For large x, differences are hardly recognizable, meaning that the borderline case of maximum snap-back voltage at exclusive variation of x is given by the omission of the sinker electrode.

The increased snap-back voltage is explained by the highly resistive interface of the buried layer with the connecting layer. Thus, the transistor function is actually impaired, which, however, is unimportant as far as its function as ESD protective element is concerned, since at switching through the equipment in blocking direction the surface region is overwhelmed by charge carriers and thus becomes low-resistive. This is supported by an additionally appearing avalanche effect between connecting layer and surface region, which generates additional charge carriers. Thus, the novel protective device has a strongly current-dependent resistance, which becomes low-resistive at the "right" point in time, i.e. at the time of the breakdown, that is, when the protective function is activated, in order to guarantee bleeding off an ESD pulse. At large distances between sinker electrode and connecting layer (8 or 10 micrometer) the avalanche effect clearly appears between the connecting layer and the surface region: The respective characteristic curves demonstrate a smaller increase in the high current region than in the case x=0, i.e. the high current resistance of the collector interface is then even lowered in comparison to an arrangement in which the buried layer is connected relatively low-resistively to the connecting layer via the sinker electrode.

What is claimed is:

1. A protective device against an electrostatic discharge for an integrated circuit arranged in a semiconductor substrate doped by a first doping type, comprising:
   a transistor diode arranged vertically to a surface of the semiconductor substrate in a surface field doped by a second doping type that is opposite to the first doping type, wherein:
      a base-emitter configuration of the transistor diode is mounted at the surface, and
      a collector of the transistor diode is developed as a buried layer doped by the second doping type;
   a connecting layer, wherein:
   the connecting layer is doped by the second doping type, the connecting layer is laterally displaced by a first distance from the transistor diode,
      the connecting layer is inserted in the surface field for contacting the buried layer so that, when the transistor diode is polarized in a blocking direction, a punch-through occurs at the connecting layer before a breakdown can occur between the surface field and the base-emitter configuration, and
      the connecting layer, on sides facing away from the surface, is completely surrounded by a region of the surface field having a lesser doping of the second doping type than the connecting layer so that a current path between the buried layer and the connecting layer continuously proceeds via the region; and
   a sink diffusion region inserted in the surface field and doped with the second doping type, the sink diffusion region overlapping the buried layer and reaching up to the surface, wherein:
      a second distance not equal to zero between the sink diffusion region and the connecting layer is dimensioned corresponding to a snap-back voltage of the transistor diode.

2. The protective device according to claim 1, wherein:
   the first distance between the connecting layer and the base-emitter configuration is dimensioned corresponding to a breakdown voltage of the transistor diode.

3. The protective device according to claim 1, wherein:
   the semiconductor substrate is p-doped, and
   the surface field is developed as an n-doped epitactic layer.

4. The protective device according to claim 3, wherein:
   the base-emitter configuration includes a p-doped well inserted into the surface field and forming a base of the transistor diode.

5. The protective device according to claim 4, further comprising:
   a strongly p-doped region inserted into the p-doped well;
   a strongly n-doped region inserted into the p-doped well; and
   a metallic line via which the strongly p-doped region and the strongly n-doped region are connected to each other.

6. The protective device according to claim 5, wherein:
   the metallic line includes an emitter electrode mounted on the surface.

7. The protective device according to claim 3, wherein:
   the buried layer is strongly n-doped and is arranged between the substrate and the surface field, and
   the buried layer extends at least underneath the base-emitter configuration.

8. The protective device according to claim 7, wherein:
   the buried layer extends underneath the connecting layer.

9. The protective device according to claim 3, wherein:
   the connecting layer is strongly n-doped.

10. The protective device according to claim 3, wherein:
    the sink diffusion region is strongly n-doped.

11. The protective device according to claim 1, wherein:
    the semiconductor substrate is n-doped, and
    the surface field is developed as an p-doped epitactic layer.

12. The protective device according to claim 11, wherein:
    the base-emitter configuration includes a n-doped well inserted into the surface field and forming a base of the transistor diode.

13. The protective device according to claim 12, further comprising:
    a strongly n-doped region inserted into the n-doped well;
    a strongly p-doped region inserted into the n-doped well; and
    a metallic line via which the strongly n-doped region and the strongly p-doped region are connected to each other.

14. The protective device according to claim 13, wherein:
the metallic line includes an emitter electrode mounted on the surface.

15. The protective device according to claim 11, wherein:
the buried layer is strongly p-doped and is arranged between the substrate and the surface field, and
the buried layer extends at least underneath the base-emitter configuration.

16. The protective device according to claim 15, wherein:
the buried layer extends underneath the connecting layer.

17. The protective device according to claim 11, wherein:
the connecting layer is strongly p-doped.

18. The protective device according to claim 11, wherein:
the sink diffusion region is strongly p-doped.

* * * * *